(12) United States Patent
Zhong et al.

(10) Patent No.: US 9,709,635 B2
(45) Date of Patent: Jul. 18, 2017

(54) SYSTEM AND METHOD FOR SOC ESTIMATION OF A BATTERY

(71) Applicant: University of Electronic Science and Technology of China, Chengdu, Shichuan (CN)

(72) Inventors: Qishui Zhong, Shichuan (CN); Baihua Li, Shichuan (CN); Hui Li, Shichuan (CN); Yuqing Zhao, Shichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 666 days.

(21) Appl. No.: 14/192,867

(22) Filed: Feb. 27, 2014

(65) Prior Publication Data

US 2014/0316728 A1 Oct. 23, 2014

(30) Foreign Application Priority Data

Jun. 20, 2013 (CN) .......................... 2013 1 0245252

(51) Int. Cl.
*G06F 17/50* (2006.01)
*G01R 31/36* (2006.01)

(52) U.S. Cl.
CPC ....... *G01R 31/3651* (2013.01); *G01R 31/361* (2013.01); *G01R 31/362* (2013.01)

(58) Field of Classification Search
USPC ................................................ 702/63; 703/2
See application file for complete search history.

(56) References Cited

U.S. PATENT DOCUMENTS

2014/0244225 A1* 8/2014 Balasingam ........ G06F 17/5036
703/2

* cited by examiner

*Primary Examiner* — Lam Nguyen
(74) *Attorney, Agent, or Firm* — Maschoff Brennan

(57) ABSTRACT

The present invention provides a SOC estimation method applied to a battery system comprising a battery pack. The SOC estimation method comprises the steps of: determining an initial SOC value; determining whether the battery pack is in a working status; measuring the voltage and current of the battery pack if the battery pack is in the working status; calculating a current SOC value by using an ampere-hour method based on the initial SOC value and the measured voltage and current; determining dynamic characteristic parameters of the battery pack; and optimizing the current SOC value by using extended Kalman filter (EKF) method and based on the dynamic characteristic parameters of the battery pack.

16 Claims, 7 Drawing Sheets

SYSTEM AND METHOD FOR SOC ESTIMATION OF A BATTERY

TECHNICAL FIELD

The present invention is related to Li-ion battery management systems, and more particularly to a system and method for state of charge (SOC) estimation of Li-ion batteries.

BACKGROUND

As the energy-saving and environmental issues have become increasingly prominent, lithium ion (Li-ion) battery, due to its advantages of high specific energy and green environmental protection, have been widely used as large capacity power supply in various fields such as electronic-powered automotive, aerospace, ship gradually. With the development of li-ion battery technology, energy density of li-ion battery becomes higher and higher, quantity of battery units in a battery pack also becomes larger and larger. After long-time use of a battery pack, asymmetry developed among the batteries in the battery pack can cause one or more of the batteries overcharging or over-discharging, and subsequently lowers the performance of the battery pack in the whole, resulting in serious effect on the service life of the battery pack. Therefore, a battery management system for managing and monitoring the working state of the battery pack is indispensable.

In practice, state of charge (SOC) is an important reference parameter of the working state of the li-ion battery pack, and is usually employed to indicate remainder energy of the li-ion battery pack. Accurate SOC estimation of the li-ion battery pack utilized in automobiles can not only tell drivers of correct estimated mileage of the automobiles, but also ensure charging/discharging optimization of the li-ion battery pack, which ensures safe utility of the li-ion battery pack. When the automobile is running, large currents may cause the battery pack to be overly discharged and subsequently destroy the battery pack. Therefore, real time collection of voltage, temperature, and charging/discharging current of each battery is important for accurate SOC estimation of the battery so as to prolong the life of the battery pack and increase performance of the automobile.

The SOC can be estimated based on attribute parameters such as voltage, current, resistance, temperature of the battery. The attribute parameters of the battery generally can change in accordance with the aging of the battery and other uncertain factors, such as random road conditions the automobile is going through.

Currently, the most popular method for SOC estimation of battery is the so-called ampere-hour method, which is also a relatively accurate method on SOC estimation. The ampere-hour method employs real time current integral to calculate ampere hour, and then revises temperature, self-discharging data and ageing parameters that can affect the SOC estimation, and eventually obtains a relatively accurate SOC value by using a revision function and said parameters. However, the above-mentioned method is still far from being sufficient for practical situations because there are many other factors that could practically affect SOC estimation of the battery, and because it is hard to achieve the revision function in practice. Therefore, to date the SOC value estimated by employing the ampere-hour method can be far from the real SOC value of the battery. Other existing methods for SOC estimation include constant current/voltage method, open circuit voltage method, specific density method, and so on. These methods each have more or less defects that would lead to inaccurate SOC value. Therefore, a novel method needs to be developed for accurate SOC estimation of a battery pack.

BRIEF DESCRIPTION OF THE DRAWINGS

The details as well as other features and advantages of this invention are set forth in the remainder of the specification and are shown in the accompanying drawings.

DETAILED DESCRIPTION OF THE EMBODIMENTS

Figure 1:
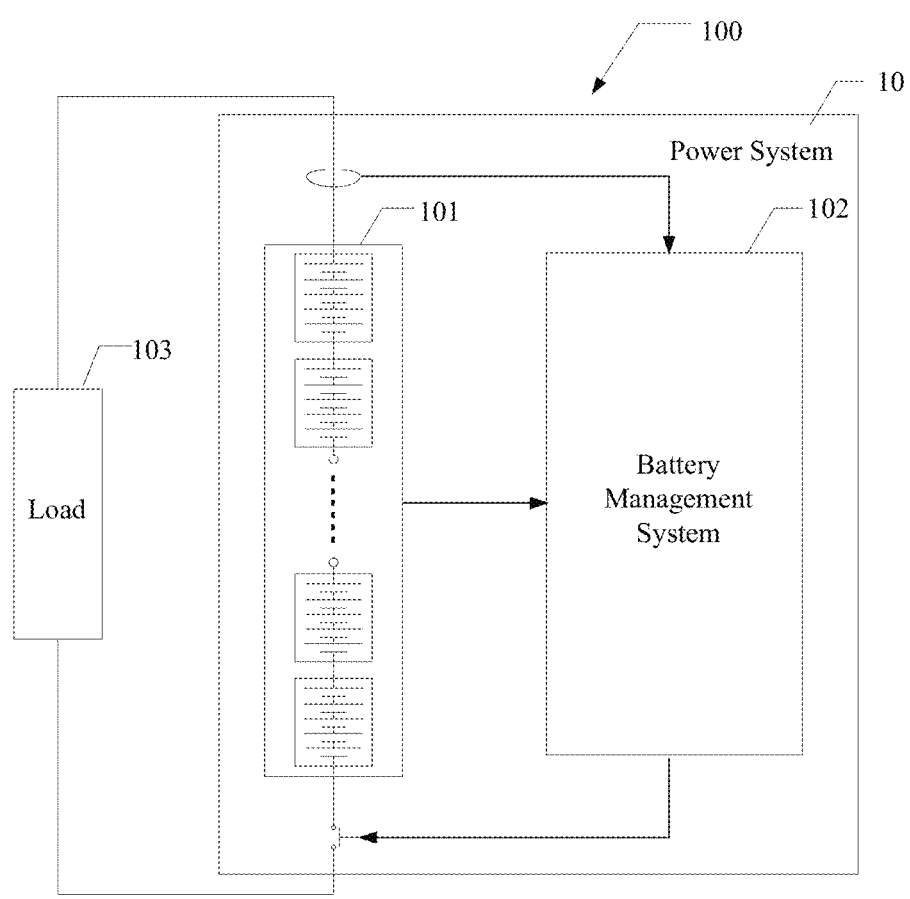
FIG. 1 is a schematic diagram of a battery system device including a battery management system according to embodiments of the present disclosure.

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

In the exemplary embodiment of the present invention, a battery system device 100, such as an electric bicycle, an electric vehicle or an integrated power storage system, generally comprises a battery pack 101, a battery management system (BMS) 102 for managing the battery pack 101, and a load 103 powered by the battery pack 101. In the preferred embodiment of the present invention, the battery pack 101 may comprise only one single battery, or is composed of many batteries serially connected one by one. In the condition that the battery pack 101 comprises just one battery, the battery pack 101 can also be called battery 101. For consistency, in this embodiment, a single battery is marked as a battery unit, therefore, the battery pack 101 may comprise one or more battery units. The battery management system 102 is used to manage and maintain the battery pack 101, comprising but not limited to providing over-voltage and/or over-current protection, state of charge (SOC) estimation of the battery pack 101. In the exemplary embodiment, the battery pack 101 and the battery management system 102 collectively form a power system 10 of the battery system device 100. The load 103 may be any kind of power consumption device, such as motors employed by the electric bicycle or the electric vehicle. In the exemplary embodiment, the battery pack 101 or the battery unit described hereinafter is lithium ion (Li-ion) typed.

Figure 2:
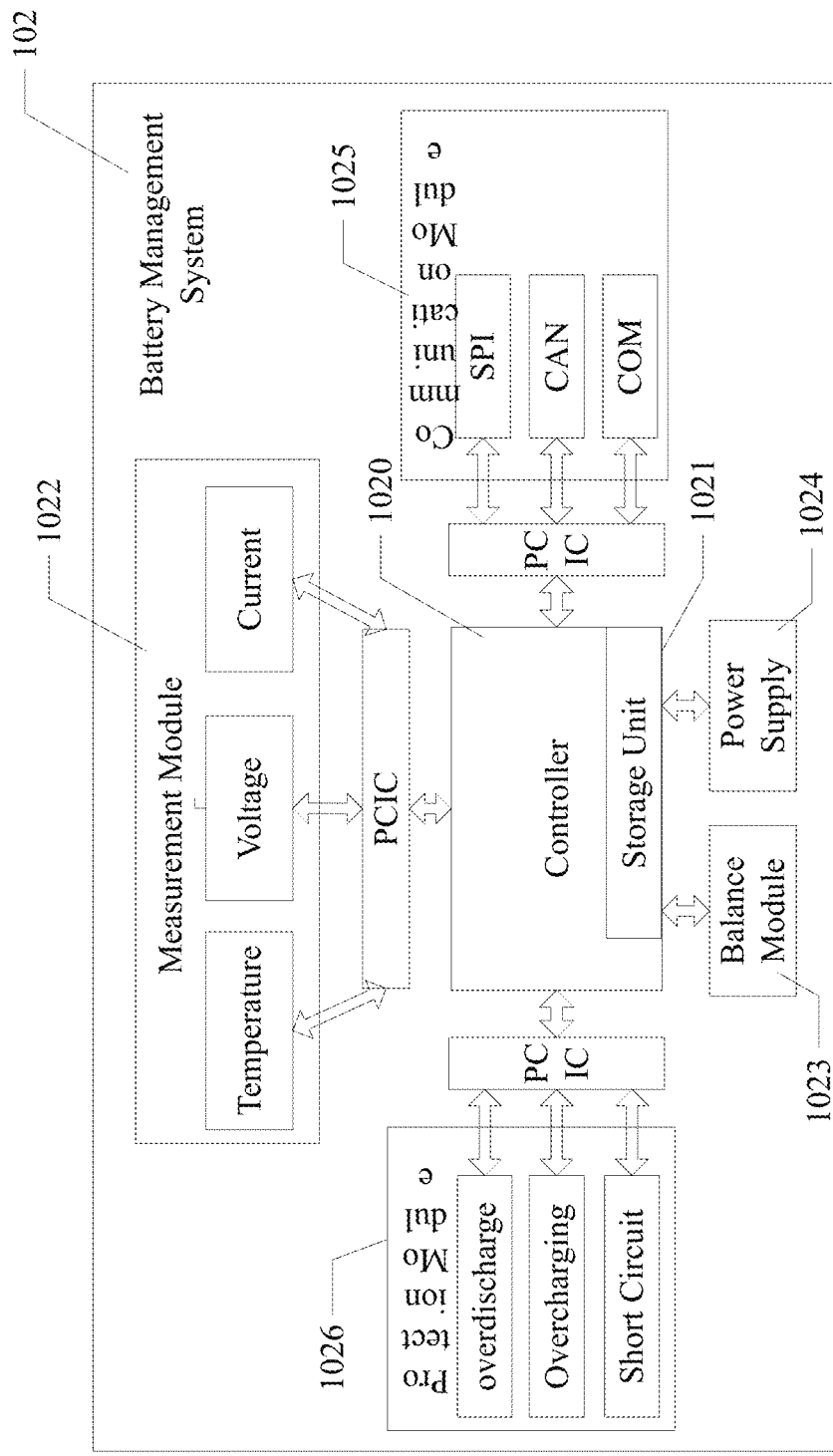
FIG. 2 is a schematic diagram of the battery management system according to a preferred embodiment.

FIG. 2 is a detailed description of the battery management system 102. In the preferred embodiment of the present disclosure, the battery management system 102 comprises a controller 1020, a storage unit 1021, a measurement module 1022, a balance module 1023, a power supply 1024, a communication module 1025, and a protection module 1026. In a preferred embodiment, the measurement module 1022, the communication module 1025 and the protection module 1026 are electronically connected to the controller 1020 by way of photoelectric coupling isolation circuits (PCIC), respectively.

In the preferred embodiment, the storage unit 1021 may be a memory integrated with the controller 1020, such as a flash memory, a static random access memory (SRAM), an electrically erasable programmable read-only memory (EEPROM). In other embodiments, the storage unit 1021 may be those storage apparatuses independent from but electrically connected to the controller 1021, such as a solid state disk or a micro hard disk. In alternative embodiments, the storage unit 1021 may be the combination of the memory and the storage apparatus. The storage unit 1021 stores program codes that can be executed by the controller 1021 to maintain the battery pack 101, for example, estimating the SOC of the battery pack 101. The storage unit 1021 is also used to store data generated during the SOC estimation in accordance with the preferred embodiment of the present invention.

In an exemplary embodiment, the controller 1020 is the PIC18F458 type chip produced by Microchip Technology Incorporation. The PIC18F458 type chip is an 8-bit microcontroller with 32 Kilobytes memory space for storing program codes, 1536 bytes-sized SRAM and 256 bytes-sized EEPROM. The PIC18F458 type chip further comprises a clock with frequency up to 32 MegaHz, which can operate as an external crystal oscillator circuit for, such as timing. Another outstanding feature of the PIC18F458 type chip is that the power consumption of the chip is relatively low. For example, under a sleeping mode, current consumed by the chip is only 0.2 μA.

The measurement module 1022 is an important part of the battery management system 102, and is used for measuring parameters such as current, voltage, and temperature of the battery pack 101. The measured parameters are not only basis for the SOC estimation, but security guarantee of the battery pack 101. In this disclosure, the current measurement comprises measuring the current flowing through the battery pack 101. The voltage measurement comprises measuring the voltage of the battery pack 101, and the voltage of each battery unit in the battery pack 101, providing the battery pack 101 comprises more than one battery units. The temperature measurement comprises measuring the temperature of the battery units in the battery pack 101. In this embodiment, the measured current, voltage and temperature data are stored in the storage unit 1021.

The balance module 1023 is used for balancing the charging/discharging current of the battery pack 101. In an exemplary embodiment, the balancing module 1023 comprises monitoring chip LTC6803 and other accompanied circuits provided by Linear Technology Corporation.

The power supply 1024 is used for providing various reference voltages to different function modules, such as the controller 1021, the monitoring chip LTC6803, etc. In this embodiment, the power supply 1024 employs the LM2009 chip to provide fixed voltage, such as 15V, and uses other DC/DC regulator, such as LM7805 chip, to convert the fixed 15V voltage to various DC outputs, such as 10V, 5V, and provides the converted DC outputs to the different function modules.

The communication module 1025 provides communication services for above-mentioned function modules. The communication services comprise a serial peripheral interface (SPI), a controller area network (CAN), and serial communication.

The protection module 1026 provides protections under the conditions such as over-current, over-voltage, under-voltage, to ensure normal operation of the battery system device 100, especially the battery pack 101.

In the preferred embodiment of the present invention, before the SOC estimation of the battery pack 101, electrochemical parameters of the battery pack 101 should be obtained.

1. Obtaining Electrochemical Parameters of the Battery Pack

The electrochemical performance of the battery unit in the battery pack 101 generally presents non-linear characteristic. In the preferred disclosure of the present invention, a second order RC equivalent circuit is employed to simulate the battery unit, in that the second order RC equivalent circuit owns the benefits comprising, for example, the order is relatively low, and parameters thereof are easily to be obtained. Particularly, the second order RC equivalent circuit can be easily constructed and preferably simulates dynamic characteristics of the battery unit under working status. The dynamic characteristics comprise an ohmic resistance $R_0$, an electrochemical polarization resistance $R_e$, an electrochemical polarization capacitor $C_e$, a concentration polarization resistance $R_d$ and a concentration polarization capacitor $C_d$. By using certain methods acted on the battery unit, the dynamic characteristics can be achieved to describe the electrochemical characteristics of the battery unit, subsequently to aid to estimate the state of charge of the battery unit in the battery pack 101.

Figure 3:
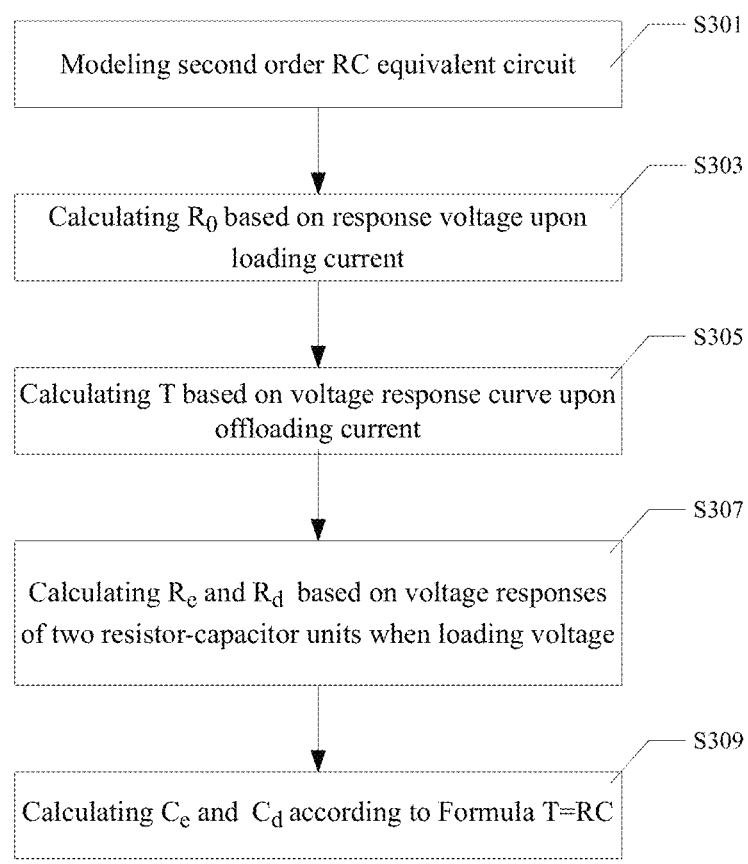
FIG. 3 is a flowchart of a method for obtaining parameters of a second order RC equivalent circuit simulating the battery unit in accordance with an exemplary disclosure of the present invention.
Figure 4A:
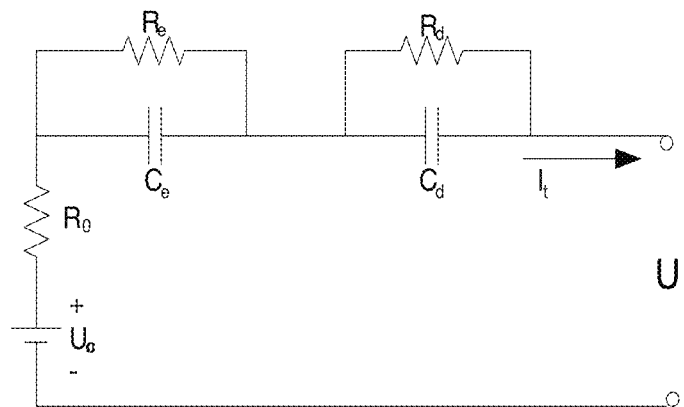
FIG. 4A is an exemplary second order RC equivalent circuit simulating the battery unit.

FIG. 3 is a flowchart of a method for obtaining parameters of the second order RC equivalent circuit simulating the battery unit in accordance with an exemplary disclosure of the present invention. At step S301, the second order RC equivalent circuit simulating the battery unit is constructed, as illustrated in FIG. 4A. The constructed second order RC equivalent circuit comprises the ohmic resistance $R_0$, the electrochemical polarization resistance $R_e$, the electrochemical polarization capacitor $C_e$, the concentration polarization resistance $R_d$ and the concentration polarization capacitor $C_d$. In the exemplary embodiment, the electrochemical polarization resistance $R_e$, the electrochemical polarization capacitor $C_e$ are connected in parallel to form a capacitance-resistance segment of electrochemical polarization, and the concentration polarization resistance $R_d$ and the concentration polarization capacitor $C_d$ are connected in parallel to form a capacitance-resistance segment of concentration polarization. The ohmic resistance $R_0$, the capacitance-resistance segment of electrochemical polarization, and the capacitance-resistance segment of concentration polarization are connected in series. In this embodiment, values of the ohmic resistance $R_0$, the electrochemical polarization resistance $R_e$, the electrochemical polarization capacitor $C_e$, the concentration polarization resistance $R_d$ and the concentration polarization capacitor $C_d$ would be obtained by an experimental method. In the exemplary embodiment, the experimental method comprises the following steps:

Step I: keeping the battery unit under a status without charging or discharging over one hour;

Step II: discharging the battery unit continuously lasting for 900 seconds;

Step III: keeping the battery unit under the status without charging or discharging for a relatively long time, such as one hour, up to the end of the experiment.

Figure 4B:
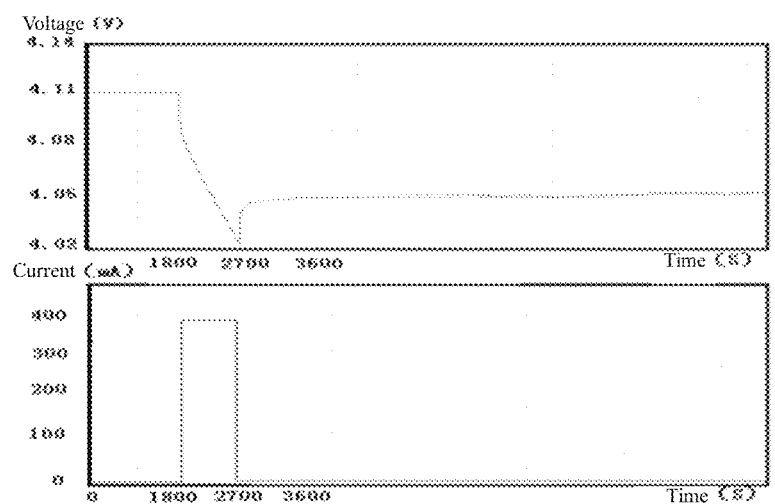
FIG. 4B shows the curve line of voltage changes corresponding to the discharging currents with time elapsing.

FIG. 4B shows the curve line of voltage changes corresponding to the discharging currents with time elapsing.

1.1 Identifying $R_0$

In the exemplary embodiment, firstly, placing one battery unit under a status without charging or discharging over one hour; then loading a discharge current pulse on a positive electrode and a negative electrode of the battery unit, for example, at the time point of 1800 s shown in FIG. 4B. When the discharge current pulse is loaded, a responsive voltage upon between the positive electrode and the negative electrode of the battery unit gets a downward mutation. After continuous discharging for 900 s, at the time point of the 2700 s shown in FIG. 4B, the discharge current pulse is removed, and the responsive voltage upon the positive electrode and the negative electrode of the battery unit gets a upward mutation. In the exemplary disclosure, the status without charging or discharging of the battery could be defined as an idle status of the battery unit.

Based on the second order RC equivalent circuit simulating the battery unit, the voltage upon the capacitance-resistance segment of concentration polarization composed of the concentration polarization resistance $R_d$ and the concentration polarization capacitor $C_d$ could not get a mutation, due to the exist of the concentration polarization capacitor $C_d$. In the same way, due to the exist of the electrochemical polarization capacitor $C_e$, the voltage upon the capacitance-resistance segment of electrochemical polarization composed of the electrochemical polarization resistance $R_e$ and the electrochemical polarization capacitor $C_e$ also could not get a mutation. Therefore, the downward mutation and the upward mutation can only be caused by the ohmic resistance $R_0$. According to the above-mentioned theory, at step S303, the resistance value $R_0$ of the ohmic resistance $R_0$ can be calculated by dividing the voltage change by the discharge current, that is, $R_0 = \Delta U/I_t$.

1.2 Identifying $\tau_e$ and $\tau_d$

In the exemplary disclosure, time constants of the capacitance-resistance segment of electrochemical polarization and the capacitance-resistance segment of concentration polarization are respectively represented by $\tau_e$ and $\tau_d$, wherein $\tau_e = R_e * C_e$, $\tau_d = R_d * C_d$.

As shown in FIG. 4B, after the time point of 2700 s, the discharge current pulse is removed, the voltage upon the ohmic resistance $R_0$ would become 0 due to no currents flowing through the ohmic resistance $R_0$. The upward mutation of the voltage upon the positive electrode and the negative electrode of the battery unit, as shown in FIG. 4B, is caused by electronic discharging of the capacitors $C_d$ and $C_e$, which are charged when the battery unit is discharging. When the capacitors $C_d$ and $C_e$ discharge completely, the voltage upon the positive electrode and the negative electrode of the battery unit becomes stable at, for example, about 4.05 v as shown in FIG. 4B.

After the discharge current pulse being removed, the voltage upon the positive electrode and the negative electrode of the battery unit is close to electromotive force of the battery unit. In an exemplary disclosure, supposing the time point t of removing the discharge current pulse is zero time, the voltage response upon the positive electrode and the negative electrode of the battery unit at the time point t could be deemed as zero state response:

$$u(t) = U_{oc} - U_{ed} = U_{oc} - \left(U_d e^{\frac{t}{\tau_d}} + U_e e^{\frac{t}{\tau_e}}\right) \quad (1\text{-}1)$$

Figure 4C:
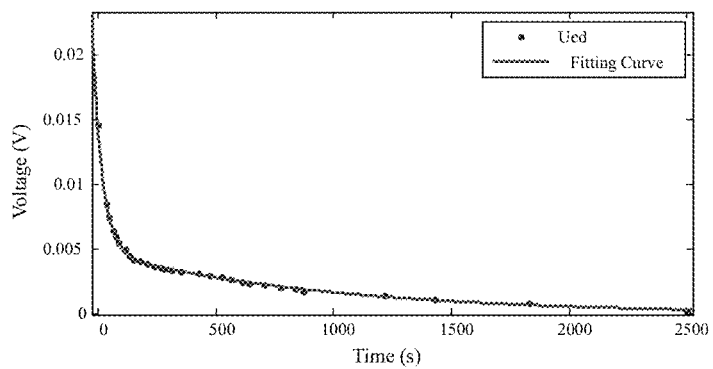
FIG. 4C shows a fitting curve representing values of $U_{ed}$ of FIG. 4A after the discharge current being removed.

Here, $U_d$ and $U_e$ respectively stand for voltages loaded upon the capacitors $C_d$ and $C_e$, $U_{ed}$ represents the voltage loaded upon the series circuit composed of the capacitance-resistance segment of electrochemical polarization and the capacitance-resistance segment of concentration polarization. FIG. 4C shows a fitting curve representing values of $U_{ed}$ after the discharge current being removed. At step S305, with the MATLAB software provided by the MathWorks company, $\tau_e$ and $\tau_d$ can be achieved by using the exponent curve fitting module in the MATLAB software.

1.3 Identifying $R_d$ and $R_e$

According to the above-mentioned description, at the time point of 1800 s shown in FIG. 4B, the voltage upon the positive electrode and the negative electrode of the battery unit declines due to the ohmic resistance $R_0$, the capacitance-resistance segment of electrochemical polarization and the capacitance-resistance segment of concentration polarization. Because the battery unit has been place at the idle status for a long time period, such as over one hour, the capacitor $C_e$ in the capacitance-resistance segment of electrochemical polarization and the capacitor $C_d$ in the capacitance-resistance segment of concentration polarization could be deemed as zero electron state. In an exemplary disclosure, supposing the time point t of loading the discharge current pulse is zero time, voltage response of the capacitor $C_e$ and $C_d$ to the discharge current pulse is a zero state response:

$$U(t) = U_{oc} - U_{red} = U_{oc} - I\left[R_d\left(1 - e^{\frac{t}{\tau_d}}\right) + R_e\left(1 - e^{\frac{t}{\tau_e}}\right)\right] - IR_0 \quad 1\text{-}2$$

Figure 4D:
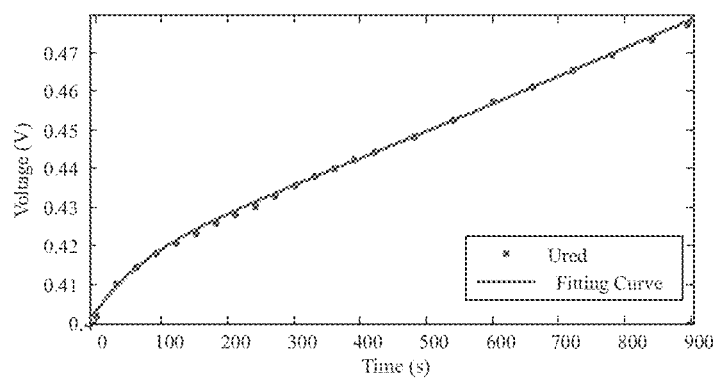
FIG. 4D shows a fitted voltage loaded upon the series circuit composed of the capacitance-resistance segment of electrochemical polarization and the capacitance-resistance segment of concentration polarization of FIG. 4A.

The voltage $U_{ed}$ loaded upon the series circuit composed of the capacitance-resistance segment of electrochemical polarization and the capacitance-resistance segment of concentration polarization is fitted as shown in FIG. 4D. At step S307, putting the calculated $\tau_e$ and $\tau_d$ into the formula 1-2, and by using the exponent curve fitting method of the MATLAB software, the $R_d$ and $R_e$ can be achieved.

1.4 Identifying $C_d$ and $C_e$

At step S309, based on the formula $\tau = R*C$, it can be concluded that C is equal to $\tau/R$. Because the time constants $\tau_e$ and $\tau_d$, the resistance values $R_d$ and $R_e$ of the polarization resistances $R_d$ and $R_e$ are achieved, it is easy to achieve values $C_d$ and $C_e$ of the polarization capacitors $C_d$ and $C_e$.

In the preferred embodiment of the disclosure, the second order RC equivalent circuit is used to simulate the battery unit. Therefore, the identified parameters of the second order RC equivalent circuit are indeed dynamic characteristic paramters of the battery unit. According to above-described identifying processes, in one embodiment of the present disclosure, identified dynamic characteristic parameters of one exemplary battery unit are shown in following table:

| Parameter | Identified value |
|---|---|
| $R_0$ | 34.5 mΩ |
| $R_d$ | 21.45 mΩ |

-continued

| Parameter | Identified value |
|---|---|
| $R_e$ | 10.6 mΩ |
| $C_d$ | 4768.74 F |
| $C_e$ | 3678.21 F |

In the preferred embodiment, the parameters of the second order RC equivalent circuit simulating the battery unit which are identified by way of said-mentioned method are stored in the storage unit 1021, and would be invoked in estimating processed when the battery unit is used in practice.

2. SOC Estimation of the Battery Pack in Use

Figure 5:
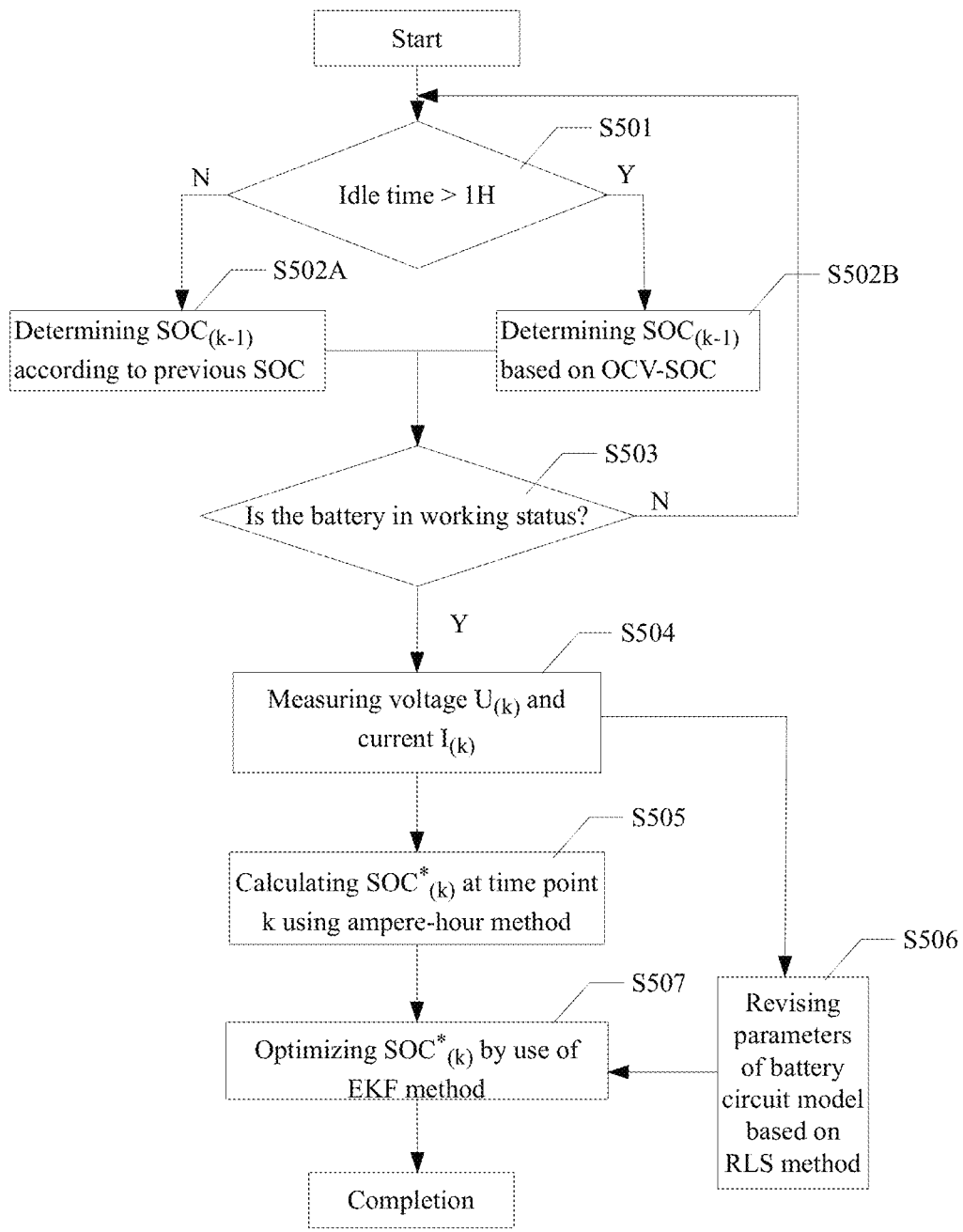
FIG. 5 is a flow chart of SOC estimation method of the battery pack in use according to a preferred embodiment of the present disclosure.

FIG. 5 is a flow chart of SOC estimation method of the battery pack 101 in use according to a preferred embodiment of the present disclosure, which could be applied to the battery system device 100 of FIG. 1. For example, the SOC estimation method could be realized by the controller 1020 executing the programmed codes stored in the storage unit 1021. In the preferred embodiment, the SOC estimation method is periodically executed by the controller 1020 to achieve a relatively accurate SOC of the battery pack 101 in different time points. A time cycle the method being executed periodically could be, for example, 10 millisecond (ms). In other embodiment, the time period could be set or configured as other value, such 15 ms. In the preferred embodiment, an once-through operation of the SOC estimation method is described as one SOC estimation process.

In the exemplary embodiment, the clock in the controller 1020 would record the time duration of the battery pack 101 being in the idle state in which there is no charging or discharging occurred to the battery pack 101. For simplicity of description, the time duration of the battery pack 101 in the idle state is simplified as an idle time of the battery pack 101. At the beginning of each SOC estimation process, some program codes would be executed to determine whether the idle time of the battery pack 101 is longer than a predefined time period, such as one hour, at step S501.

If the idle time of the battery pack 101 is not longer than the predefined time period, at step S502A, the controller 1020 reads a previous SOC value (here marked as $SOC_{(k-1)}$) generated during a previous SOC estimation process, and regards the $SOC_{(k-1)}$ as an initial SOC value of a current SOC estimation process.

In the preferred embodiment of the present invention, if the battery pack 101 is in the idle state for a relatively long time, for example, over one hour, an open circuit voltage (OCV) of the battery pack 101 is substantially equal to an electromotive force of the battery pack 101. Therefore, if the idle time of the battery pack 101 is longer than the predefined time period, at step S502B, the measurement module 1022 measures a current voltage upon the positive electrode and the negative electrode of the battery pack 101, subsequently, the controller 1020 queries an OCV-SOC mapping table to determine a SOC value corresponding to the current voltage, and records the determined SOC value as $SOC_{(k-1)}$. The $SOC_{(k-1)}$ would act as an initial SOC value of a current SOC estimation process.

It should be noted, step S502A and step S502B are alternative in one SOC estimation process according to a preferred embodiment of the present invention.

In the preferred embodiment, the OCV-SOC mapping table is established by an experimental method. The experiment method for establishing the OCV-SOC mapping table comprises the steps of:

A) charging the battery pack 101, fully and completely;

B) placing the battery pack 101 in the idle status, without charging or discharging, for over one hour;

C) discharging the battery pack 101 to reduce 5 percent of the SOC of the battery pack 101 by using a programmable electronic load, recording the open circuit voltage of the battery pack 101 and subsequently placing the battery pack 101 in the idle state for over one hour;

D) repeating said step C), under constant temperature of substantially 20 degree Celsius, until the battery pack 101 discharges completely;

E) establishing the OCV-SOC mapping table based on the recorded open circuit voltage and corresponding SOC of the battery pack 101.

Figure 6:
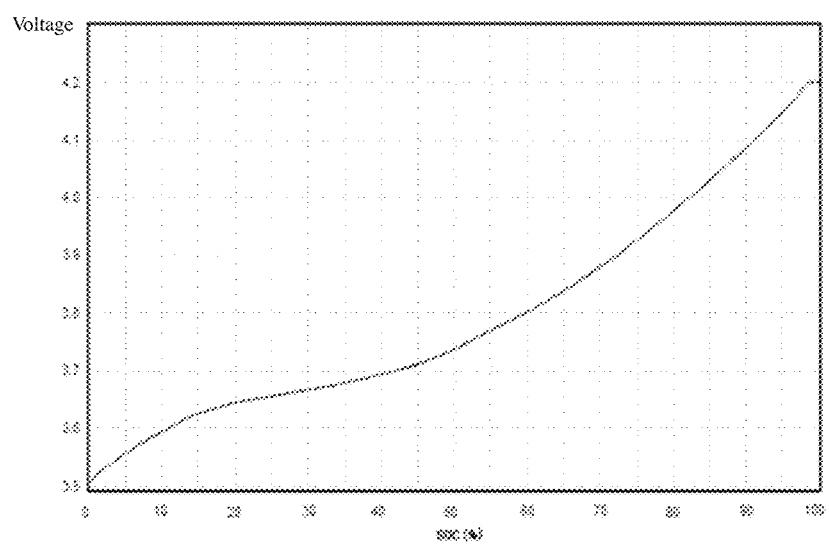
FIG. 6 is an exemplary OCV-SOC mapping table.

In this exemplary disclosure, the programmable electronic load employs Chroma 6310A type programmable DC electronic load provided by Chroma Company. FIG. 6 is an exemplary OCV-SOC mapping table of an 18650 type li-ion battery, which is obtained by using the experiment method for establishing the OCV-SOC mapping table.

At step S503, the controller 1020 determines whether the battery pack 101 is in a working status. In the exemplary disclosure, the working status is opposite to the idle status, that is, the working status means the battery pack 101 is discharging and/or charging. In other words, the controller 1020 determines the batter pack 101 is in the working status if the battery pack 101 is discharging and/or charging. If the battery pack 101 is not in the working status, or is in the idle status, the flow returns to step S501 to determine whether an idle time of the battery pack 101 is longer than the predefined time period in another SOC estimation process.

If the battery pack 101 is in the working status, at step S504, the measurement module 1022 measures current $I_{(k)}$ flowing through and voltage $U_{(k)}$ upon the two polarities of the battery pack 101. In the preferred embodiment of the present disclosure, when measuring the current $I_{(k)}$, a direction of the measured current $I_{(k)}$ shows the discharging or charging status of the battery pack 101. Hereinafter, if the battery pack 101 is discharging, the current $I_{(k)}$ is positive, and if the battery pack 101 is charging, the current $I_{(k)}$ is negative.

At step S505, an ampere hour method is employed to estimate $SOC_{(k)}$ in current SOC estimation process, based on the determined $SOC_{(k-1)}$ in step S502A or S502B.

2.1 Ampere Hour Method

The ampere hour method is also called current integration method, which is a fundamental method to measure the SOC of batteries. In current SOC estimation process, after determining the $SOC_{(k-1)}$ in step S502A or S502B, the battery pack 101 is charging or charging from time point k−1 to k, such as 10 ms, a change of the SOC of the battery pack 101 could be represented as:

$$\Delta SOC = \frac{1}{Q_0} I(k)T \tag{2-1}$$

Here, $Q_0$ is a total quantity of electric discharge in fixed current of 0.1*C of the battery pack 101, wherein C represents the nominal capacity of the battery pack 101. $I_{(k)}$ represents the charging or discharging current of the battery pack 101, wherein $I_{(k)}$ is positive if the battery pack 101 is discharged, otherwise the $I_{(k)}$ is negative.

Peukert proposes an empirical formula to revise the SOC of the battery pack 101 working with changing currents, as shown in following formula 2-2:

$$I^n * t = K \tag{2-2}$$

Here, I represents discharging current, t is a discharging time length, n and K are constants that are determined by types and active materials of the battery pack 101. In the exemplary disclosure, the active material is lithium.

By multiplying two sides of the formula 2-2 by $I^{1-n}$, a new expression is obtained:

$$Q = I^* t = I^{1-n} * K \tag{2-3}$$

Here, if $I=I_0=0.1*C$, Q is equal to $Q_0$ mentioned above; if $I=0.5*C$, Q is marked as Q1. According to expression 2-3, $Q_0 = I_0^{1-n} * K$, $Q_1 = I^{1-n} * K$. Therefore, $Q_1/Q_0 = (I/I_0)^{1-n}$. Assuming $Q_1/Q_0 = \eta$, $Q1 = \eta * Q_0$. If $k_\eta = 1/\eta$, an initial SOC estimation value $SOC^*_{(k)}$ considering charge/discharge rate is:

$$SOC^*_{(k)} = SOC_{(k-1)} - k_\eta * I(k) * T/Q_0 \tag{2-4}$$

Here, $k_\eta$ is a revise value to the capacity volume of the battery pack 101. $SOC^*_{(k)}$ is an initial estimation of the SOC of the battery pack 101 by using the ampere-hour method, which would be further corrected in the following descriptions.

2.2 Recursive Least Square (RLS) Method

At step S506, a recursive least square (RLS) method is employed to, based on parameters $R_{o(k-1)}$, $R_{e(k-1)}$, $C_{e(k-1)}$, $R_{d(k-1)}$, $C_{d(k-1)}$ obtained in the previous SOC estimation process and the voltage $U_{(k)}$ and the current $I_{(k)}$ measured at step S504, revise and achieve another set of parameters $R_{o(k)}$, $R_{e(k)}$, $C_{e(k)}$, $R_{d(k)}$, $C_{d(k)}$ at the current time point k in the current SOC estimation process. The parameters $R_{o(k-1)}$, $R_{e(k-1)}$, $C_{e(k-1)}$, $R_{d(k-1)}$, $C_{d(k-1)}$ obtained in the previous SOC estimation process are stored in the storage unit 1021. If it is a first SOC estimation process when the battery pack 101 is in use, the $R_{o(k-1)}$, $R_{e(k-1)}$, $C_{e(k-1)}$, $R_{d(k-1)}$, $C_{d(k-1)}$ would be those parameters identified according to the method described in FIG. 3.

Based on the battery model shown in FIG. 4A, and according to Kirchhoff laws and Laplace transform, it could be drawn upon changing time domain t to Laplace domain s:

$$U(s) = I(s)\left(R_0 + \frac{R_e}{1+R_eC_e s} + \frac{R_d}{1+R_dC_d s}\right) \tag{2-5}$$

Here, the most right part of the formula is defined as battery transfer function:

$$G(s) = R_0 + \frac{R_e}{1+\tau_e s} + \frac{R_d}{1+\tau_d s} \tag{2-6}$$

The battery transfer function 2-6 could be transformed to a discrete form as following expression 2-7 by way of the bilinear transformation method:

$$G(z^{-1}) = \frac{\beta_0 + \beta_1 Z^{-1} + \beta_2 Z^{-2}}{1 + \alpha_1 Z^{-1} + \alpha_2 Z^{-2}} \tag{2-7}$$

An difference equation of the expression 2-7 could be expressed as following:

$$U(k) = -\alpha_1 U(k-1) - \alpha_2 U(k-2) + \beta_0 I(k) + \beta_1 I(k-1) + \beta_2 I(k-2) \tag{2-8}$$

Here, given $\theta = [\alpha_1\ \alpha_2\ \beta_0\ \beta_1\ \beta_2]$, $h^T(k) = [-U(k-1)\ -U(k-2)\ I(k)\ I(k-1)\ I(k-2)]$, it can be concluded:

$$U(k) = h^T(k)\theta + e(k) \tag{2-9}$$

Expression 2-10 shows fundamental algorithm of the recursive least square (RLS) method:

$$\begin{cases} \hat{\theta}(k) = \hat{\theta}(k-1) + K(k)[y(k) - h^T(k)\hat{\theta}(k-1)] \\ K(k) = P(k-1)h(k)[h^T(k)P(k-1)h(k) + \lambda]^{-1} \\ P(k) = \frac{1}{\lambda}[I - K(k)h^T(k)]P(k-1) \end{cases} \tag{2-10}$$

Here, $K_{(k)}$ is a gain factor, $P_{(k-1)}$ represents a covariance matrix upon the $(k-1)_{th}$ measurement. In the preferred embodiment of the present disclosure, the $K_{(k)}$ is set as 5, and $P_{(k-1)}$ is equal to $\alpha I_n$, wherein $\alpha$ is a giant number and is set as $10^5$ in this disclosure, $I_n$ is an identity matrix of size n, which is the n×n square matrix, with matrix elements being ones on the main diagonal and zeros elsewhere.

According to the formula (2-10), $\hat{\theta}(k)$ could be calculated, which could be regarded as a current $\theta$. Because $\theta = [\alpha_1\ \alpha_2\ \beta_0\ \beta_1\ \beta_2]$, $\alpha_1$, $\alpha_2$, $\beta_0$, $\beta_1$, $\beta_2$ could be subsequently obtained.

Putting $\alpha_1$, $\alpha_2$, $\beta_0$, $\beta_1$, $\beta_2$ into an inverse equation 2-11, the parameters $R_{o(k)}$, $R_{e(k)}$, $C_{e(k)}$, $R_{d(k)}$, $C_{d(k)}$ at the current time point k in the current SOC estimation process could be achieved. In the inverse equation 2-11, T is a sampling cycle, which is the time interval of the RLS method being executed.

$$\begin{cases} R_0 = \dfrac{\beta_0 - \beta_1 + \beta_1}{1 - \alpha_1 + \alpha_2} \\ \tau_e \tau_d = \dfrac{T^2(1 - \alpha_1 + \alpha_2)}{4(1 + \alpha_1 + \alpha_2)} \\ \tau_e + \tau_d = \dfrac{T(1 - \alpha_2)}{1 + \alpha_1 + \alpha_2} \\ R_0 + R_e + R_d = \dfrac{\beta_0 - \beta_1 + \beta_1}{1 + \alpha_1 + \alpha_2} \\ R_0 \tau_e + R_0 \tau_d + R_e \tau_d + R_d \tau_e = \dfrac{T(\beta_0 - \beta_1)}{1 + \alpha_1 + \alpha_2} \end{cases} \tag{2-11}$$

The achieved parameters $R_{o(k)}$, $R_{e(k)}$, $C_{e(k)}$, $R_{d(k)}$, $C_{d(k)}$ are stored in the storage unit 1021, and used as basis of a next SOC estimation process.

At step S507, $SOC^*_{(k)}$ obtained at step S505 would be revised by using the parameters $R_{o(k)}$, $R_{e(k)}$, $C_{e(k)}$, $R_{d(k)}$, $C_{d(k)}$ achieved at step S506 in light of extended kalman filter (EKF) method.

2.3 Extended Kalman Filter (EKF) Method

Equation of state employed by the EKF method in the preferred embodiment could be expressed as following:

$$X_k = A_k X_{(k-1)} + B_k I_k + W_k \tag{2-12}$$

Here, $X_k$ stands for a variable of state, $A_k$ represents a gain matrix of the variable of state at the time point k, $B_k$ represents a gain matrix of an input variable at the time pint k, $I_k$ is the input variable at the time point k, $W_k$ means process noises.

An observer output equation of the EKF method is:

$$Y_k = C_k X_k + Z_k \tag{2-13}$$

Here, $Y_k$ is an observer output vector, $C_k$ is a transfer matrix of the variable of state at the time point k, $Z_k$ means system observing value at the time point k.

A state space equation employed by the EKF method is as following expression:

$$\begin{cases} SOC(k) = SOC^*(k) - \dfrac{k_\eta T}{Q_0} I(k) \\ U_e(k) = e^{-\frac{T}{\tau_{e(k-1)}}} U_e(k-1) + \left(1 - e^{-\frac{T}{\tau_{e(k-1)}}}\right) R_e(k-1) I(k) \\ U_e(k) = e^{-\frac{T}{\tau_{e(k-1)}}} U_e(k-1) + \left(1 - e^{-\frac{T}{\tau_{d(k-1)}}}\right) R_d(k-1) I(k) \end{cases} \quad (2\text{-}14)$$

Here, $SOC^*_{(k)}$ obtained at step S505 would be served as an input of the expression 2-14.

In the expression 2-14, $U_e$ and $U_d$ are voltages respectively loaded upon the capacitors $C_e$ and $C_d$, $I_{(k)}$ is the current obtained at the measurement step S504.

In the exemplary embodiment of the present disclosure, the method for revising the $SOC^*_{(k)}$ by using the EKF method comprises the following steps:

Step 1: Determining the Linear Coefficient of the Variable of State

Based on the parameters $R_{o(k)}$, $R_{e(k)}$, $C_{e(k)}$, $R_{d(k)}$, $C_{d(k)}$ achieved at step S506, one can compute $\tau_e$ and $\tau_d$. Then, the following coefficient matrixes $A_k$, $B_k$ and $D_k$ can be calculated. According to the OCV-SOC curve of the battery pack 101, coefficient matrixes $C_k$ can be obtained.

$$A_k = \begin{bmatrix} 1 & 0 & 0 \\ 0 & e^{-\frac{T}{\tau_{e(k)}}} & 0 \\ 0 & 0 & e^{-\frac{T}{\tau_{d(k)}}} \end{bmatrix}$$

$$B_k = \begin{bmatrix} -k_\eta T/Q_0 \\ R_e\left(1 - e^{-\frac{T}{\tau_{e(k)}}}\right) \\ R_d\left(1 - e^{-\frac{T}{\tau_{d(k)}}}\right) \end{bmatrix}$$

$$C_k = \begin{bmatrix} \dfrac{\partial U_{oc}}{\partial SOC} \Big|_{SOC = S\hat{O}C(K)^-} & -1 & -1 \end{bmatrix}^T$$

$$D_k = -R_0(k)$$

Step 2: Initiating the Variable of State

In this disclosure, the initiation of the variable of state comprises initiating three components of $X_{(k-1)}^+$ with $SOC^*(k)$, 0, 0, respectively, and initiating $P_{(k-1)}^+$ with the varance of $X_{(k-1)}^+$, i.e., $\text{var}(X_{(k-1)}^+)$, as following:

$X_{(k-1)}^+ = [SOC^*(k)\ 0\ 0]^T$
$P_{(k-1)}^+ = \text{var}(X_{(k-1)}^+)$

Here, $SOC^*(k)$ is the result obtained at step S505.

Step 3: EKF Iteration

The following expression 2-15 is an EKF iteration formula:

$$\begin{cases} X_k^- = A_k P_{k-1}^+ + B_k I(k) \\ P_k^- = A_k P_{k-1}^+ A_k^T + D_w \\ L_k = P_k^- C_k^T (C_k P_k^- C_k^T + D_v)^{-1} \\ X_k^+ = X_k^- + L_k(U_k - U(k)) \\ P_k^+ = (1 - L_k C_k) P_k^- \end{cases} \quad (2\text{-}15)$$

In the expression 2-15, $U_k$ is the voltage obtained at the measurement step S504, $P_k$ is mean squared estimation error matrix at time point k, $L_k$ is the Kalman system gain, $D_w$ and $D_v$ stand respectively for system noises and measurement noises, which are determined by noises of practical systems. In the exemplary disclosure, the system noise $D_w$ and measurement noise $D_v$ are both set as normal distribution noises with mean of 0 and squared error of 0.1.

Iterating with the expression 2-15, a best variable of state would be achieved: $X_k^+ = [SOC(k)\ U_e(k)\ U_d(k)]^T$. According to the best variable of state, a best state of charge, SOC(, can be retrieved.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof The presently disclosed embodiments are therefore to be considered in all respects as illustrative and not restrictive, the scope of the invention being indicated by the appended claims, and not limited to the foregoing description.

What is claimed is:

1. A SOC estimation method applied to a battery system device comprising a battery pack, the SOC estimation method comprising a plurality of SOC estimation processes each further comprising:
    determining an initial SOC value by:
        determining whether an idle time of the battery pack is longer than a predefined time period;
        reading a previous SOC value generated during a previous SOC estimation process if the idle time of the battery pack is no longer than the predefined time period, and determining the previous SOC value as the initial SOC value; and
        determining the initial SOC based on an OCV-SOC mapping table of the battery pack if the idle time of the battery pack is longer than the predefined time period;
    determining whether the battery pack is in a working status;
    measuring the voltage and current of the battery pack if the battery pack is in the working status;
    calculating a current SOC value by using an ampere-hour method based on the initial SOC value and the measured voltage and current;
    determining dynamic characteristic parameters of the battery pack; and
    optimizing the current SOC value by using extended Kalman filter (EKF) method and based on the dynamic characteristic parameters of the battery pack.

2. The SOC estimation method of claim 1, wherein determining whether the battery pack is in the working status comprises determining whether the battery pack is charging or discharging.

3. The SOC estimation method of claim 1, wherein the predefined time period is one hour.

4. The SOC estimation method of claim 1, wherein the OCV-SOC mapping table of the battery pack is achieved by using the following steps:
    keeping battery units of the battery pack under a status without charging or discharging over one hour;
    discharging the battery unit continuously lasting for 900 seconds; and keeping the battery unit under the status without charging or discharging for relatively long time.

5. The SOC estimation method of claim 1, wherein the idle time of the battery pack is the time duration of the battery pack without charging or discharging activities.

6. The SOC estimation method of claim 1, wherein the OCV-SOC mapping table of the battery pack is established by:
A) charging the battery pack fully and completely;
B) placing the battery pack in an idle status, without charging or discharging, for over one hour;
C) discharging the battery pack to reduce 5 percent of the SOC of the battery pack by using a programmable electronic load, recording the open circuit voltage of the battery pack and subsequently placing the battery pack in the idle state for over one hour;
D) repeating said step C), under constant temperature of substantially 20 degree Celsius, until the battery pack discharges completely; and
E) establishing the OCV-SOC mapping table based on the open circuit voltages and corresponding SOC values of the battery pack recorded in step C) and step D).

7. The SOC estimation method of claim 1, wherein the dynamic characteristic parameters of the battery pack is determined in each SOC estimation process based on dynamic characteristic parameter obtained in a previous SOC estimation process and the measured voltage and current.

8. The SOC estimation method of claim 1, wherein the step of optimizing the current SOC value by using extended Kalman filter method comprises:
determining the linear coefficient of the variable of state based on the dynamic characteristic parameters of the battery pack;
initiating the variable of state; and
iterating using the EKF method.

9. A SOC estimation system in a battery system device comprising a battery pack, the SOC estimation system comprising a controller and relevant storage unit, the storage unit storing a plurality of executable programs, the controller executing the programs to reach the functions including:
determining an initial SOC value by:
determining whether an idle time of the battery pack is longer than a predefined time period;
reading a previous SOC value generated during a previous SOC estimation process if the idle time of the battery pack is no longer than the predefined time period, and determining the previous SOC value as the initial SOC value; and
determining the initial SOC based on an OCV-SOC mapping table of the battery pack if the idle time of the battery pack is longer than the predefined time period;
determining whether the battery pack is in a working status;
measuring the voltage and current of the battery pack if the battery pack is in the working status;
calculating a current SOC value by using an ampere-hour method based on the initial SOC value and the measured voltage and current;
determining dynamic characteristic parameters of the battery pack; and
optimizing the current SOC value by using extended Kalman filter (EKF) method and based on the dynamic characteristic parameters of the battery pack.

10. The SOC estimation system of claim 9, wherein the battery pack is in the working status comprises the battery pack is charging or discharging.

11. The SOC estimation method of claim 9, wherein the predefined time period is one hour.

12. The SOC estimation method of claim 9, wherein the OCV-SOC mapping table of the battery pack is achieved by using the following steps:
keeping battery units of the battery pack under a status without charging or discharging over one hour;
discharging the battery unit continuously lasting for 900 seconds; and
keeping the battery unit under the status without charging or discharging for relatively long time.

13. The SOC estimation method of claim 9, wherein the idle time of the battery pack is the time duration of the battery pack without charging or discharging activities.

14. The SOC estimation method of claim 9, wherein the OCV-SOC mapping table of the battery pack is established by:
A) charging the battery pack fully and completely;
B) placing the battery pack in an idle status, without charging or discharging, for over one hour;
C) discharging the battery pack to reduce 5 percent of the SOC of the battery pack by using a programmable electronic load, recording the open circuit voltage of the battery pack and subsequently placing the battery pack in the idle state for over one hour;
D) repeating said step C), under constant temperature of substantially 20 degree Celsius, until the battery pack discharges completely; and
E) establishing the OCV-SOC mapping table based on the open circuit voltages and corresponding SOC values of the battery pack recorded in step C) and step D).

15. The SOC estimation method of claim 9, wherein the dynamic characteristic parameters of the battery pack is determined in each SOC estimation process based on dynamic characteristic parameter obtained in a previous SOC estimation process and the measured voltage and current.

16. The SOC estimation method of claim 9, wherein the function of optimizing the current SOC value comprises:
determining the linear coefficient of the variable of state based on the dynamic characteristic parameters of the battery pack;
initiating the variable of state; and
iterating using the EKF method.

* * * * *